US006579467B2

(12) United States Patent
Li et al.

(10) Patent No.: US 6,579,467 B2
(45) Date of Patent: Jun. 17, 2003

(54) FERROELECTRIC COMPOSITION, FERROELECTRIC VAPOR DEPOSITION TARGET AND METHOD OF MAKING A FERROELECTRIC VAPOR DEPOSITION TARGET

(75) Inventors: Jianxing Li, Spokane, WA (US); Tim Scott, Post Falls, ID (US); Tamara White, Spokane, WA (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 10/143,318

(22) Filed: May 8, 2002

(65) Prior Publication Data

US 2002/0132721 A1 Sep. 19, 2002

Related U.S. Application Data

(63) Continuation of application No. 09/465,546, filed on Dec. 16, 1999, now Pat. No. 6,451,222.

(51) Int. Cl.[7] .................. C04B 35/01; C04B 35/465; C04B 35/491; C04B 35/495
(52) U.S. Cl. .................. 252/62.9 R; 252/62.9 PZ; 501/134; 501/135; 501/136; 501/137; 264/674; 264/667; 264/668
(58) Field of Search .................. 501/134, 135, 501/136, 137; 264/614, 667, 668; 252/62.9 PZ, 62.9 R

(56) References Cited

U.S. PATENT DOCUMENTS 3,666,666 A    5/1972    Haertling (List continued on next page.)

FOREIGN PATENT DOCUMENTS

JP    06-081138    3/1994

(List continued on next page.)

OTHER PUBLICATIONS

Yeon et al., "Electrical Characteristics of the MOD–derived SrBi2xTa2O9 and SrBi2.4(TA,Nb)2O9 Thin Films", Journal of Materials Science, 35(10), pp. 2405–2411, May 15, 2000. Abstract only.

(List continued on next page.)

Primary Examiner—C. Melissa Koslow
(74) Attorney, Agent, or Firm—Wells St. John P.S.

(57) ABSTRACT

The invention comprises ferroelectric vapor deposition targets and to methods of making ferroelectric vapor deposition targets. In one implementation, a ferroelectric physical vapor deposition target has a predominate grain size of less than or equal to 1.0 micron, and has a density of at least 95% of maximum theoretical density. In one implementation, a method of making a ferroelectric physical vapor deposition target includes positioning a prereacted ferroelectric powder within a hot press cavity. The prereacted ferroelectric powder predominately includes individual prereacted ferroelectric particles having a maximum straight linear dimension of less than or equal to about 100 nanometers. The prereacted ferroelectric powder is hot pressed within the cavity into a physical vapor deposition target of desired shape having a density of at least about 95% of maximum theoretical density and a predominate maximum grain size which is less than or equal to 1.0 micron. In one implementation, the prereacted ferroelectric powder is hot pressed within the cavity into a physical vapor deposition target of desired shape at a maximum pressing temperature which is at least 200° C. lower than would be required to produce a target of a first density of at least 85% of maximum theoretical density in hot pressing the same powder but having a predominate particle size maximum straight linear dimension of at least 1.0 micron at the same pressure and for the same amount of time, and a target density greater than the first density at the lower pressing temperature is achieved.

10 Claims, 1 Drawing Sheet

U.S. PATENT DOCUMENTS

| | | | |
|---|---|---|---|
| 3,923,675 | A | 12/1975 | Mazdiyasni et al. |
| 5,066,617 | A | 11/1991 | Tanemoto et al. |
| 5,312,790 | A | 5/1994 | Sengupta et al. |
| 5,314,651 | A | 5/1994 | Kulwicki |
| 5,435,826 | A | 7/1995 | Sakakibara et al. |
| 5,486,491 | A | 1/1996 | Sengupta et al. |

FOREIGN PATENT DOCUMENTS

| | | |
|---|---|---|
| JP | 09-249967 | 11/1997 |
| JP | 11323539 | 11/1999 |

OTHER PUBLICATIONS

Yan et al., "Preparation on the [(Pb,La) (Zr,Ti)O3] Ferroelectric Thin Films by Using the Sol–Gel Processing", Piezoelectrics and Acoustooptics, vol. 17, issue n 5, Oct. 1995, pp. 24–27.

Haertling, Gene H., "Hot–Pressed Ferroelectric Lead Zirconate Tianate Ceramics for Electro–Optical Applications", *Ceramic Bulletin*, vol. 49, No. 6, pp. 564–567 (1970).

Foster, N.F., "Composition and Structure of Sputtered Films of Ferroelectric Niobates", *J. Vac. Sci. Technol.*, No. 8(1), pp. 251–255 (1971).

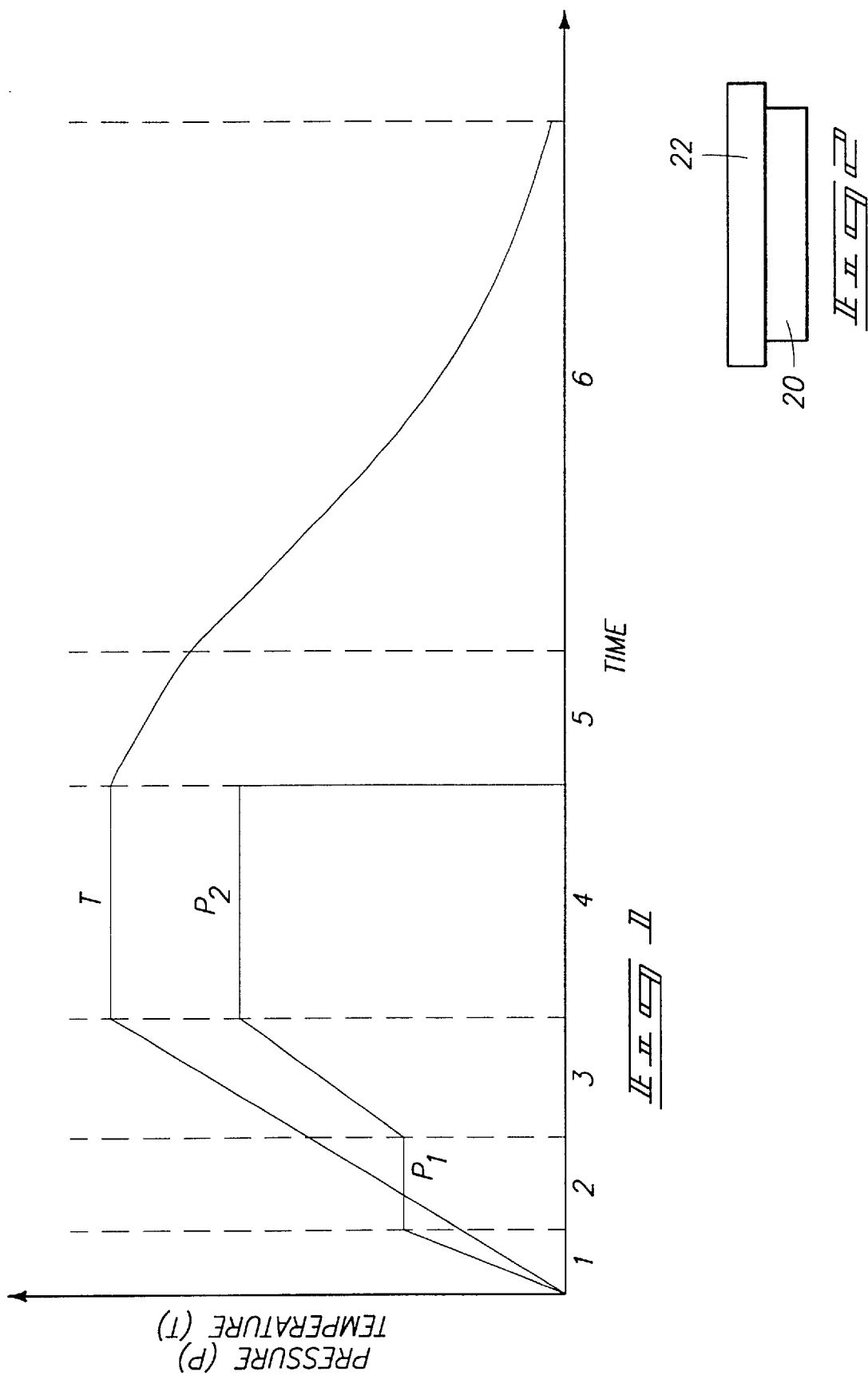

FERROELECTRIC COMPOSITION, FERROELECTRIC VAPOR DEPOSITION TARGET AND METHOD OF MAKING A FERROELECTRIC VAPOR DEPOSITION TARGET

RELATED APPLICATION DATA

This application is a continuation of U.S. patent application Ser. No. 09/465,546, which was filed on Dec. 16, 1999, now U.S. Pat. No. 6,451,222.

TECHNICAL FIELD

This invention relates to ferroelectric compositions, to ferroelectric vapor deposition targets and to methods of making ferroelectric vapor deposition targets.

BACKGROUND OF THE INVENTION

Ferroelectric materials are a family of high K dielectric materials that are starting to become used more in the microelectronics fabrication industry. In addition to having high dielectric constants, ferroelectric materials typically have low leakage current and non-volatile data retention properties which make them attractive as dielectric materials for memory and transistor devices. Ferroelectric materials exhibit a number of unique and interesting properties. One such property of a ferroelectric material is that it possesses a spontaneous polarization that can be reversed by an applied electric field. Specifically, these materials have a characteristic temperature commonly referred to as the transition temperature, at which the material makes a structural phase change from a polar phase (ferroelectric) to a non-polar phase, typically called the paraelectric phase. Example ferroelectric materials include titanates and tantalates, such as by way of example only, lead lanthanum zirconium titanate (PLZT), barium strontium titanate (BST), and strontium bismuth tantalate (SBT).

As memory cell density and other circuitry density increases, there is a continuing challenge to maintain sufficiently high storage capacitance in capacitors despite the decreasing size. Additionally, there is a continuing goal to further decrease capacitor size. One principal way of increasing cell capacitance is through cell structure techniques. Yet as feature size continues to become smaller and smaller, development of improved materials for the cell dielectric become increasingly important. Conventional non-ferroelectric dielectric materials, such as $SiO_2$ and $Si_3N_4$, are not expected to be suitable in most applications where device dimensions decrease to 0.25 micron in width because of the expected requirement for a very thin dielectric film. This is expected to apply in most all thin film dielectric material applications.

In addition to use as transistor and capacitor dielectrics, ferroelectric materials might also be used in microelectronic mechanical systems. These devices are mechanical three-dimensional constructions with sizes in the micrometer ranges. Sensors and actuators are example two main categories of microelectronic mechanical systems. Ferroelectric thin films have been proposed for use with silicon-based microelectronic mechanical systems for both sensors and actuators in a variety of applications.

Thin film ferroelectric materials are known within the art to be deposited by chemical vapor deposition, chemical solution deposition or physical vapor deposition. Physical vapor deposition includes sputtering, laser ablation, and other existing and to-be-developed methods. Existing ferroelectric physical deposition targets are typically made using conventional powder metallurgy with either cold press sintering or hot pressing. Such prior methods can include the provision of prereacted ferroelectric powders having individual particles sized at greater than or equal to 1 micron. In hot pressing, such powders are consolidated at high temperatures and pressure, and typically results in targets having non-uniform grain sizes of from 1 micron to 50 microns and non-uniform microstructure comprising multiple phases.

It would be desirable to improve upon existing ferroelectric physical vapor deposition targets and their methods of manufacture.

SUMMARY

The invention comprises ferroelectric compositions, ferroelectric vapor deposition targets and methods of making ferroelectric vapor deposition targets. In one implementation, a ferroelectric physical vapor deposition is target has a predominate grain size of less than or equal to 1.0 micron, and has a density of at least 95% of maximum theoretical density.

In one implementation, a method of making a ferroelectric physical vapor deposition target includes positioning a prereacted ferroelectric powder within a hot press cavity. The prereacted ferroelectric powder predominately includes individual prereacted ferroelectric particles having a maximum straight linear dimension of less than or equal to about 100 nanometers. The prereacted ferroelectric powder is hot pressed within the cavity into a physical vapor deposition target of desired shape having a density of at least about 95% of maximum theoretical density and a predominate maximum grain size which is less than or equal to 1.0 micron.

In one implementation, the prereacted ferroelectric powder is hot pressed within the cavity into a physical vapor deposition target of desired shape at a maximum pressing temperature which is at least 200° C. lower than would be required to produce a target of a first density of at least 85% of maximum theoretical density in hot pressing the same powder but having a predominate particle size maximum straight linear dimension of at least 1.0 micron at the same pressure and for the same amount of time, and a target density greater than the first density at the lower pressing temperature is achieved.

BRIEF DESCRIPTION OF THE DRAWINGS

Preferred embodiments of the invention are described below with reference to the following accompanying drawings.

FIG. 1 is a graph of pressure and temperature versus time for exemplary preferred processing in accordance with a methodical aspect of the invention.

FIG. 2 is a diagrammatic sectional view of a physical vapor deposition target adhered to a backing plate in accordance with but one aspect of the invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

The invention comprises a method of making a ferroelectric physical vapor deposition target using hot pressing. A prereacted ferroelectric powder is provided and positioned within a hot press cavity. In the context of this document, "prereacted" means that the material of the powder has previously been reacted to predominantly comprise the substantial composition of what will be the finished material of the physical vapor deposition target being produced. The prereacted ferroelectric powder predominately comprises individual prereacted ferroelectric particles having a maximum straight linear dimension of less than or equal to about 100 nanometers. More preferably, at least 90% of the prereacted ferroelectric particles have a maximum straight linear dimension of less than or equal to about 100 nanometers, and even more preferably at least 98%, with all references in the specification and claims to particle percents being by volume. Further most preferably, any agglomeration of individual particles is preferably from 0% to 10%, with any agglomerated particles having a maximum straight linear dimension which is less than 100 microns, and more preferably from to 10 to 50 microns in maximum straight linear dimension.

Further preferably, the powder comprises substantially single phase crystalline material, although multiphase crystalline materials are contemplated. Also, a preferred maximum straight linear dimension of the individual prereacted ferroelectric particles is from about 10 nanometers to about 50 nanometers, with a maximum size of around 30 nanometers being most preferred.

The prereacted ferroelectric powder can also contain one or more various doping elements, preferably if included up to no more than 10 at %, for physical property or process improvement. Example elements include lanthanum, calcium, niobium, strontium and bismuth, and most preferably to a doping level of from 2 at % to 5 at %.

By way of example only, one specific class of ferroelectric materials include $(Ba_{1-x}Sr_x)TiO_3$, where x is from 0.0 to 1.0, and more preferably where x is from 0.3 to 0.7. Another example includes $(Pb_{1+y}La_z)(Zr_{1-x}Ti_x)O_3$, where x is from 0.0 to 1.0, y is from 0.0 to 0.2, and z is from 0.0 to 0.1, and more preferably where x is from 0.3 to 0.7, y is from 0.05 to 0.15, and z is from 0.0 to 0.05. Further by of example only, another class includes $(Sr_{1+y}Bi_{2+z})(Ta_{1-x}Nb_x)_2O_9$, where x is from 0.0 to 1.0, y is from –0.5 to 0.5, and z is from 0.0 to 0.8, and more preferably where x is from 0.3 to 0.7, y is from –0.3 to 0.3, and z is from 0.3 to 0.6.

Powders of the desired composition and particle size can be fabricated using physical vapor condensation, chemical precipitation, combustion spray pyrolysis, and other methods. Such powders are commercially available from ceramic powder vendors.

In one implementation, the prereacted ferroelectric powder is hot pressed within the cavity into a physical vapor deposition target of desired shape having a density of at least about 95% of maximum theoretical density for the material, and a predominate maximum grain size which is less than or equal to 1.0 micron. The target of desired shape may or may not be subsequently configured into another shape. Further preferably, the hot pressing is conducted to form the target to have at least 90% of its grains which are less than or equal to 1.0 micron in maximum size. Even more preferably, the hot pressing is conducted to form the target to have a predominate portion, and more preferably at least 90%, of its grains to have a maximum size of from 0.3 micron to 0.75 micron. Further, the hot pressing preferably produces the physical vapor deposition target to have a density of at least 99% of maximum theoretical density, more preferably greater than 99% maximum theoretical density, and most preferably at least 99.5% of maximum theoretical density.

The hot pressing is preferably done in a vacuum or inert atmosphere, with the resultant target possibly being somewhat reduced after consolidation, resulting in an initially oxygen deficient target. Oxygen deficiency reduces the target electrical resistance, yet can result in a higher film deposition rate. Any perceived oxygen deficiency which would otherwise occur in the deposited film can be compensated for by using an appropriate oxygen partial pressure during film deposition, and in accordance with existing prior art or other to-be-developed methods.

Temperature-pressure-time profiles for the hot pressing will be largely material dependent, and optimized by the fabricator. Example preferred processing conditions for barium strontium titanate include a maximum pressing temperature of less than or equal to about 1500° C., more preferably a maximum pressing temperature range of from 1100° C. to 1500° C., pressing time of from 30 minutes to 60 minutes, and maximum pressing pressure ranging from 3000 psi to 7000 psi. Example preferred processing conditions for lead lanthanum zirconium titanate include a maximum pressing temperature of less than or equal to about 1100° C., more preferably a maximum pressing temperature range of from 800° C. to 1100° C., pressing time from 30 minutes to 60 minutes, and maximum pressing pressure at from 3000 psi to 7000 psi. Example preferred processing conditions for strontium bismuth tantalate, with or without niobium, include pressing temperatures a maximum pressing temperature of less than or equal to about 1100° C., more preferably a maximum pressing temperature range of from 700 to 1100° C., pressing time from 30 minutes to 60 minutes, and maximum pressing pressure ranging from 3000 psi to 7000 psi. Other conditions and materials are, of course, contemplated.

An exemplary preferred qualitative profile relationship for temperature and pressure as a function of time for the hot pressing, generally regardless of material, is shown and described with respect to FIG. 1. A preferred first step is an initial pressure and temperature ramp to apply a preload temperature and pressure to the loose powder. The illustrated preferred second stage is constant preload pressure and continuing the temperature ramp. At this stage, volatile components in the powder are continuously driven out of the powder compact. A preferred third stage is a pressure and temperature ramp to the full and final highest conditions. Here, the powder compact starts to densify. A preferred fourth stage is a constant pressure and constant temperature to end the powder consolidation. A preferred fifth stage is a temperature and pressure release. At this stage, pressure is preferably completely removed, and heating reduced. A purpose is to achieve the full density at the determined pressure and temperature, and to achieve controlled cooling at a slow rate to prevent possible thermal shock and excessive strain and stress in the target. A preferred sixth and final stage is natural cooling, where heating is turned off and the target cools naturally within the press/furnace.

In another considered aspect of the invention, the prereacted ferroelectric powder is hot pressed within the cavity into a physical vapor deposition target of desired shape at a maximum pressing temperature which is at least 200° C. lower than would be required to produce a target of a first density of at least 85% of maximum theoretical density in hot pressing the same powder, but having a predominate particle size maximum straight linear dimension of at least 1.0 micron at the same pressure and for the same amount of time. In the hot pressing in accordance with this aspect of the invention, a target density greater than the first density at the lower pressing temperature is achieved.

For example, the above-preferred embodiments for barium strontium titanate, lead zirconium titanate, and strontium bismuth niobium tantalate show respective maximum pressing temperatures of 1500° C., 1100° C., and 1100° C., respectively. Prior art processing of the same materials using prior art methods are understood to use a temperature at least 200° C. higher than these indicated maximum preferred temperatures utilizing a predominate powder particle size of 1.0 micron or greater, and results in achieving no more than 90% of maximum theoretical density. In accordance with this aspect of the invention, a temperature of at least 200° C. lower is utilized, yet a higher density is attained.

FIG. 2 illustrates a finished constructed target 20 adhered to a backing plate 22, to form a useable, finished target construction. Such can be fabricated by conventional or to-be-developed methods.

Processing in the above manner, and production of the resultant target, can improve efficiency in the microelectronics manufacture of circuitry and other components where physical vapor deposition rate, film uniformity and reduction of film particulate in the finished film will preferably occur. Preferably, targets with fine grain size of the invention and high density will give high deposition rate and low film particulate, and result in a uniform and homogenous microstructure. Single phase nanopowders are preferably used, but several single phase powders can be mixed and blended to achieve a desirable composition prior to pressing. The powder is preferably not exposed to moisture prior to pressing to avoid undesired agglomeration.

Although the invention was principally motivated relative to fabrication of physical vapor deposition targets, the invention applies as well to ferroelectric ceramic compositions and methods of manufacture.

EXAMPLE 1

Nanophase PLZT Targets

A specific reduction to practice example had the composition of $Pb_{1.12}La_{0.05}(Zr_{0.40}Ti_{0.60})O_x$.

A precursor powder of single phase $Pb_{1.12}La_{0.05}(Zr_{0.40}Ti_{0.60})O_x$ was loaded into a graphite die lined with graphoil. The die assembly was pre-compacted within the hot press chamber and evacuated to a vacuum of $1\times10^{-3}$ Torr. The chamber was then back-filled with $\geq 99\%$ pure Argon to 507 Torr pressure. Subsequently, the hot press was heated to the sintering temperature (900° C.) at the rate of 300° C./h. Once peak temperature was reached, pressure was increased to 4 kpsi at the rate of 10 tons/minute. The powder compact was consolidated to high density under constant temperature (900° C.) and pressure (4 kpsi) for 60–90 minutes. Following consolidation, the pressure was released and the temperature was decreased at the rate of 200° C./h. The heaters were turned off once the temperature reached 700° C. The chamber was back-filled with Argon and allowed to cool to room temperature.

The target manufactured using the aforementioned process had a density greater than or equal to 99.5% of the theoretical density (7.66 g/cc). The microstructure was single phase with uniform composition and sub-micron grain size (0.5 µm). The resistivity was found to be $3\times10^{10}$ Ωcm, and the dielectric constant was 1000. The thermal conductivity and the co-efficient of thermal expansion of the target was measured to be 1.57 W/mK and $4.3\times10^{-7}/°$ C., respectively.

Another PLZT target was manufactured by the same process to comprise $Pb_{0.98}La_{0.22}(Zr_{0.39}Ti_{0.41})O_x$.

EXAMPLE 2

Nanophase BST Targets

A specific reduction to practice example had the composition of $Ba_{0.50}Sr_{0.50}TiO_x$.

Nanophase $Ba_{0.50}Sr_{0.50}TiO_x$ powder was loaded into a graphite die lined with graphoil. The die assembly was pre-compacted within the hot press chamber and evacuated to a vacuum of $1\times10^{-3}$ Torr. The chamber was then back-filled with $\geq 99\%$ pure Argon to 507 Torr pressure. Subsequently, the temperature was increased to the sintering temperature (1200° C.) at the rate of 300° C./h. Maximum pressure (4 kpsi) was applied at the rate of 10 tons/minute when the temperature reached 650° C. during the temperature ramp-up cycle. The powder compact was consolidated to high density under constant temperature (1200° C.) and pressure (4 kpsi) for 60 minutes following which the pressure was released and the temperature was decreased at the rate of 200° C./h. The heaters were turned off once the temperature reached 900° C. The chamber was back-filled with Argon and allowed to cool to room temperature.

The target thus obtained had a density of 5.53 g/cc, or 98.3% of its theoretical density. The microstructure is homogeneous with sub-micron grain size (<0.5 µm). Higher densities (>99% of theoretical density) can be obtained by hot pressing at higher temperatures, at the expense of significant grain growth. For example, a target has achieved 100% of its theoretical density (5.6 g/cc), when hot pressed at 1400° C. In this case, the average grain size was 10 µm, significantly greater than the 0.5 µm obtained in a target hot pressed at 1200° C.

EXAMPLE 3

Nanophase SBT Targets

A specific reduction to practice example had the composition of $Sr_{1.2}Bi_{2.4}Ta_2O_x$.

Nanophase $Sr_{1.2}Bi_{2.4}Ta_2O_x$ powder was loaded into a graphite die lined with graphoil. The die assembly was pre-compacted within the hot press chamber and evacuated to a vacuum of $1\times10^{-3}$ Torr. The chamber was then back-filled with $\geq 99\%$ pure Argon to 507 Torr pressure. The hot press was then heated to the sintering temperature (850° C.) at the rate of 300° C./h. Once peak temperature was reached, pressure was increased to 4 kpsi at the rate of 10 tons/minute. The powder compact was consolidated to high density under constant temperature (850° C.) and pressure (4 kpsi) for 60 minutes. Following consolidation, the pressure was released and the temperature was decreased at the rate of 200° C./h. The heaters were turned off once the temperature reached 700° C. The chamber was back-filled with Argon and allowed to cool to room-temperature.

The density of the target was better than 99.5% of its theoretical density. The microstructure was fairly uniform with some Bi and Sr rich regions. The Bi and Sr rich regions can be attributed to the composition of the precursor powder, containing 20 mole % excess Bi and Sr.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of making a ferroelectric physical vapor deposition target comprising:

positioning a prereacted ferroelectric powder mixture comprising multiple single phase powders within a hot press cavity, the prereacted ferroelectric powder mixture comprising $(Ba_{1-x}Sr_x)TiO_3$, where x is from 0.0 to 1.0, the prereacted ferroelectric powder mixture predominately comprising individual prereacted ferroelectric particles having a maximum straight linear dimension of less than or equal to about 100 nanometers, wherein crystalline phases comprised by the prereacted ferroelectric powder mixture include a crystalline phase of the $(Ba_{1-x}Sr_x)TiO_3$; and hot pressing the prereacted ferroelectric powder mixture within the cavity into a physical vapor deposition target of desired shape having a density of at least about 95% of maximum theoretical density and a predominate maximum grain size which is less than or equal to 1.0 micron.

2. A method of making a ferroelectric physical vapor deposition target comprising:

positioning a prereacted ferroelectric powder mixture comprising multiple single phase powders within a hot press cavity, the prereacted ferroelectric powder mixture comprising $(Ba_{1-x}Sr_x)TiO_3$, where x is from 0.3 to 0.7, the prereacted ferroelectric powder mixture predominately comprising individual prereacted ferroelectric particles having a maximum straight linear dimension of less than or equal to about 100 nanometers, wherein crystalline phases comprised by the prereacted ferroelectric powder mixture include a crystalline phase of the $(Ba_{1-x}Sr_x)TiO_3$; and hot pressing the prereacted ferroelectric powder mixture within the cavity into a physical vapor deposition target of desired shape having a density of at least about 95% of maximum theoretical density and a predominate maximum grain size which is less than or equal to 1.0 micron.

3. A method of making a ferroelectric physical vapor deposition target comprising:

positioning a prereacted ferroelectric powder mixture comprising multiple single phase powders within a hot press cavity, the prereacted ferroelectric powder mixture comprising $(Pb_{1+y}La_z)(Zr_{1-x}Ti_x)O_3$, where x is from 0.0 to 1.0, y is from 0.0 to 0.2, and z is from 0.0 to 0.1; the prereacted ferroelectric powder mixture predominately comprising individual prereacted ferroelectric particles having a maximum straight linear dimension of less than or equal to about 100 nanometers, and wherein crystalline phases comprised by the prereacted ferroelectric powder mixture include a crystalline phase of the $(Pb_{1+y}La_z)(Zr_{1-x}Ti_x)O_3$; and hot pressing the prereacted ferroelectric powder mixture within the cavity into a physical vapor deposition target of desired shape having a density of at least about 95% of maximum theoretical density and a predominate maximum grain size which is less than or equal to 1.0 micron.

4. A method of making a ferroelectric physical vapor deposition target comprising:

positioning a prereacted ferroelectric powder mixture comprising multiple single phase powders within a hot press cavity, the prereacted ferroelectric powder mixture predominately comprising individual prereacted ferroelectric particles having a maximum straight linear dimension of less than or equal to about 100 nanometers, wherein the prereacted ferroelectric powder mixture comprises one of barium strontium titanate, lead zirconium titanate, and strontium bismuth tantalate having a total of up to 10 at % of one of more doping elements of lanthanum, calcium, niobium, strontium and bismuth, and wherein crystalline phases comprised by the prereacted ferroelectric powder mixture include a crystalline phase of the one of barium strontium titanate, lead zirconium titanate, and strontium bismuth tantalate; and hot pressing the prereacted ferroelectric powder mixture within the cavity into a physical vapor deposition target of desired shape having a density of at least about 95% of maximum theoretical density and a predominate maximum grain size which is less than or equal to 1.0 micron.

5. A method of making a ferroelectric physical vapor deposition target comprising:

positioning a prereacted ferroelectric powder mixture comprising multiple single phase powders within a hot press cavity, the prereacted ferroelectric powder mixture predominately comprising individual prereacted ferroelectric particles having a maximum straight linear dimension of less than or equal to about 100 nanometers, wherein the prereacted ferroelectric powder mixture comprises one of barium strontium titanate, lead zirconium titanate, and strontium bismuth tantalate having a total of from 2.0 at % to 5.0 at % of one of more doping elements of lanthanum, calcium, niobium, strontium and bismuth, and wherein crystalline phases comprised by the prereacted ferroelectric powder mixture include a crystalline phase of the one of barium strontium titanate, lead zirconium titanate, and strontium bismuth tantalate; and hot pressing the prereacted ferroelectric powder mixture within the cavity into a physical vapor deposition target of desired shape having a density of at least about 95% of maximum theoretical density and a predominate maximum grain size which is less than or equal to 1.0 micron.

6. A method of making a ferroelectric physical vapor deposition target comprising:

positioning a prereacted ferroelectric powder mixture comprising multiple single phase powders within a hot press cavity, the prereacted ferroelectric powder mixture comprising $(Pb_{1+y}La_z)(Zr_{1-x}Ti_x)O_3$, where x is from 0.0 to 1.0, y is from 0.0 to 0.2, and z is from 0.0 to 0.1, the prereacted ferroelectric powder mixture predominately comprising individual prereacted ferroelectric particles having a maximum straight linear dimension of from about 10 nanometers to about 50 nanometers, wherein crystalline phases comprised by the prereacted ferroelectric powder mixture include a crystalline phase of the $(Pb_{1+y}La_z)(Zr_{1-x}Ti_x)O_3$; and hot pressing the prereacted ferroelectric powder mixture within the cavity into a physical vapor deposition target of desired shape having a density of at least about 99% of maximum theoretical density and at least 90% of its grains to have less than or equal to 1.0 micron in maximum size.

7. A method of making a ferroelectric physical vapor deposition target comprising:

positioning a prereacted ferroelectric powder mixture comprising multiple single phase powders within a hot press cavity, the prereacted ferroelectric powder mixture predominately comprising individual prereacted ferroelectric particles having a maximum straight linear dimension of less than or equal to about 100 nanometers; and hot pressing the prereacted ferroelectric powder mixture within the cavity into a physical vapor deposition target of desired shape at a maximum pressing temperature of less than or equal to about 1500° C. and which is at least 200° C. lower than would be required to produce a target of a first density of at least 85% of maximum theoretical density in hot pressing the same powder mixture but having a predominate particle size maximum straight linear dimension of at least 1.0 micron at the same pressure and for the same amount of time, and achieving a target density greater than the first density at the lower pressing temperature.

8. The method of claim 7 wherein the prereacted ferroelectric powder mixture comprises $(Ba_{1-x}Sr_x)TiO_3$, where x is from 0.0 to 1.0; and wherein crystalline phases comprised by the prereacted ferroelectric powder mixture include a crystalline phase of the $(Ba_{1-x}Sr_x)TiO_3$.

9. The method of claim 7 wherein the prereacted ferroelectric powder mixture comprises $(Pb_{1+y}La_z)(Zr_{1-x}Ti_x)O_3$, where x is from 0.0 to 1.0, y is from 0.0 to 0.2, and z is from 0.0 to 0.1; and wherein crystalline phases comprised by the prereacted ferroelectric powder mixture include a crystalline phase of the $(Pb_{1+y}La_z)(Zr_{1-x}Ti_x)O_3$, and the maximum pressing temperature is less than or equal to about 1100° C.

10. The method of claim 7 wherein the prereacted ferroelectric powder mixture comprises $(Pb_{1+y}La_z)(Zr_{1-x}Ti_x)O_3$, where x is from 0.0 to 1.0, y is from 0.0 to 0.2, and z is from 0.0 to 0.1; wherein crystalline phases comprised by the prereacted ferroelectric powder mixture include a crystalline phase of the $(Pb_{1+y}La_z)(Zr_{1-x}Ti_x)O_3$, and the maximum pressing temperature is from about 800° C. to about 1100° C., and at a maximum pressing pressure between about 3000 psi and 7000 psi.

* * * * *

UNITED STATES PATENT AND TRADEMARK OFFICE
CERTIFICATE OF CORRECTION

PATENT NO. : 6,579,467 B2
DATED : June 17, 2003
INVENTOR(S) : Li et al.

It is certified that error appears in the above-identified patent and that said Letters Patent is hereby corrected as shown below:

Column 1,
Line 58, replace "example" with -- examples of --.

Column 2,
Line 19, delete "is".

Column 3,
Line 38, insert -- way -- after "by".

Column 4,
Line 28, replace "700" with -- 700º C --.

Column 5,
Line 40, replace "≧" with -- ≥ --.

Column 6,
Lines 5 and 37, replace "≧" with -- ≥ --.

Signed and Sealed this

Twenty-third Day of September, 2003

JAMES E. ROGAN
*Director of the United States Patent and Trademark Office*